United States Patent
Ivanov

(10) Patent No.: US 10,855,239 B2
(45) Date of Patent: *Dec. 1, 2020

(54) AMPLIFIER CLASS AB OUTPUT STAGE

(71) Applicant: TEXAS INSTRUMENTS INCORPORATED, Dallas, TX (US)

(72) Inventor: Vadim Valerievich Ivanov, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/568,306

(22) Filed: Sep. 12, 2019

(65) Prior Publication Data

US 2020/0007099 A1 Jan. 2, 2020

Related U.S. Application Data

(63) Continuation of application No. 15/912,642, filed on Mar. 6, 2018, now Pat. No. 10,461,707.

(51) Int. Cl.
*H03F 1/02* (2006.01)
*H03F 3/45* (2006.01)
*H03F 1/22* (2006.01)

(52) U.S. Cl.
CPC ....... *H03F 3/45192* (2013.01); *H03F 1/0233* (2013.01); *H03F 1/223* (2013.01); *H03F 3/45636* (2013.01); *H03F 2203/45028* (2013.01)

(58) Field of Classification Search
USPC ................................... 330/252–261
See application file for complete search history.

(56) References Cited

U.S. PATENT DOCUMENTS

| 4,570,128 | A  | 2/1986  | Monticelli      |
| 6,657,495 | B2 | 12/2003 | Ivanov et al.   |
| 7,466,201 | B1 | 12/2008 | Ivanov et al.   |
| 7,948,278 | B2 | 5/2011  | Hasegawa et al. |

*Primary Examiner* — Hieu P Nguyen
(74) *Attorney, Agent, or Firm* — Ray A. King; Charles A. Brill; Frank D. Cimino

(57) ABSTRACT

An amplifier includes an input stage, a folded cascode stage, and a class AB output stage. The folded cascode stage is coupled to the input stage. The class AB output stage is coupled to the folded cascode stage. The class AB output stage includes a high-side output transistor, a low-side output transistor, and a high-side feedback circuit that is coupled to the high-side output transistor. The high-side feedback circuit includes a high-side sense transistor and a high-side feedback transistor. The high-side sense transistor includes a control terminal that is coupled to a control terminal of the high-side output transistor. The high-side feedback transistor is coupled to an output of the high-side sense transistor and to the folded cascode stage. A first output of the folded cascode stage is coupled to the control terminal of the high-side sense transistor and to the control terminal of the high-side output transistor.

6 Claims, 2 Drawing Sheets

AMPLIFIER CLASS AB OUTPUT STAGE

CROSS REFERENCE TO RELATED APPLICATION(S)

This continuation application claims priority to U.S. patent application Ser. No. 15/912,642, filed Mar. 6, 2018, which application is incorporated herein by reference in its entirety.

BACKGROUND

Of the many available electronic devices, operational amplifiers (op-amps) are some of the most widely used. Op-amps are efficient and versatile devices that can be used in a variety of applications, such as signal conditioning, analog instrumentation, analog computation, etc.

An op-amp may employ one of several different circuit arrangements. In one example, a class A amplifier reproduces an entire input signal because an active element of the class A amplifier, such as a transistor, is constantly in the active mode. Class A amplifiers typically have high power consumption because the active element constantly conducts current.

In another example, a class B amplifier typically employs two complementary output transistors, with each output transistor being turned on for half of the time and turned off for the other half of the time. That is, one output transistor operates as a current source, and the other output transistor operates as a current sink. This configuration is sometimes referred to as a "push-pull" configuration since a first branch of the output stage "pushes" or sources currents to a load while a second branch of the output stage "pulls" or sinks current from the load. A class B amplifier has lower power consumption than a class A amplifier but may be susceptible to crossover distortion due to the turn-on of one output transistor not matching the turn-off of the other output transistor, and may be unstable with capacitive loads at low currents.

A class AB amplifier also employs two complementary output transistors (similar to a class B amplifier). Class AB amplifiers avoid the high power consumption of a class A amplifier by always having one output branch substantially turn off when the other output branch is turned on. Although the current in one leg of a class AB amplifier is substantially turned off there is a small amount of current flowing in that leg. The small residual current in the class AB amplifier avoids the crossover distortion produced by the turning on and off of the currents in class B amplifiers. Thus, class AB amplifiers are able to achieve a relatively high current output while maintaining a low quiescent current and providing stability with capacitive loads at any load current.

SUMMARY

A class AB amplifier that provides high gain at low power supply voltages is disclosed herein. In one example, an amplifier includes an input stage, a folded cascode stage, and a class AB output stage. The folded cascode stage is coupled to the input stage. The class AB output stage is coupled to the folded cascode stage. The class AB output stage includes a high-side output transistor, a low-side output transistor, and a high-side feedback circuit. The high-side feedback circuit is coupled to the high-side output transistor. The high-side feedback circuit includes a high-side sense transistor and a high-side feedback transistor. The high-side sense transistor includes a control terminal that is coupled to a control terminal of the high-side output transistor. The high-side feedback transistor is coupled to an output of the high-side sense transistor and to the folded cascode stage. A first output of the folded cascode stage is coupled to the control terminal of the high-side sense transistor and to the control terminal of the high-side output transistor.

In another example, a class AB amplifier includes a folded cascode stage and a class AB output stage. The class AB output stage is coupled to the folded cascode stage. The class AB output stage includes a high-side output transistor, a low-side output transistor, a high-side feedback circuit, and a low-side feedback circuit. The high-side feedback circuit is coupled to the high-side output transistor. The high-side feedback circuit includes a high-side sense transistor and a first current source. The high-side sense transistor includes a control terminal and an output terminal. The control terminal is coupled to a control terminal of the high-side output transistor. The output terminal is coupled to the folded cascode stage. The first current source is coupled to an output of the high-side sense transistor and to a first reference voltage source. A first output of the folded cascode stage is coupled to the control terminal of the high-side sense transistor and to the control terminal of the high-side output transistor. The low-side feedback circuit is coupled to the low-side output transistor. The low-side feedback circuit includes a low-side sense transistor and a second current source. The low-side sense transistor includes a control terminal and an output terminal. The control terminal is coupled to a control terminal of the low-side output transistor. The output terminal is coupled to the folded cascode stage. The second current source is coupled to an input of the low-side sense transistor and to a second reference voltage source. A second output of the folded cascode stage is coupled to the control terminal of the low-side sense transistor and to the control terminal of the low-side output transistor.

In a further example, a class AB amplifier includes a high-side output transistor, a low-side output transistor, a folded cascode stage, a high-side feedback circuit, and a low-side feedback circuit. The folded cascode stage is coupled to the high-side output transistor and the low-side output transistor. The high-side feedback circuit is coupled to the high-side output transistor. The high-side feedback circuit includes a high-side sense transistor and a high-side feedback transistor. The high-side sense transistor includes a control terminal and an output terminal. The control terminal is coupled to a control terminal of the high-side output transistor. The output terminal is coupled to the folded cascode stage. The high-side feedback transistor is coupled to an output of the high-side sense transistor and to the folded cascode stage. A first output of the folded cascode stage is coupled to the control terminal of the high-side sense transistor and to the control terminal of the high-side output transistor. The low-side feedback circuit is coupled to the low-side output transistor. The low-side feedback circuit includes a low-side sense transistor and a low-side feedback transistor. The low-side sense transistor includes a control terminal and an output terminal. The control terminal is coupled to a control terminal of the low-side output transistor. The output terminal is coupled to the folded cascode stage. The low-side feedback transistor is coupled to an output of the low-side sense transistor and to the folded cascode stage. A second output of the folded cascode stage is coupled to the control terminal of the low-side sense transistor and to the control terminal of the low-side output transistor.

BRIEF DESCRIPTION OF THE DRAWINGS

For a detailed description of various examples, reference will now be made to the accompanying drawings in which.

DETAILED DESCRIPTION

Figure 1:
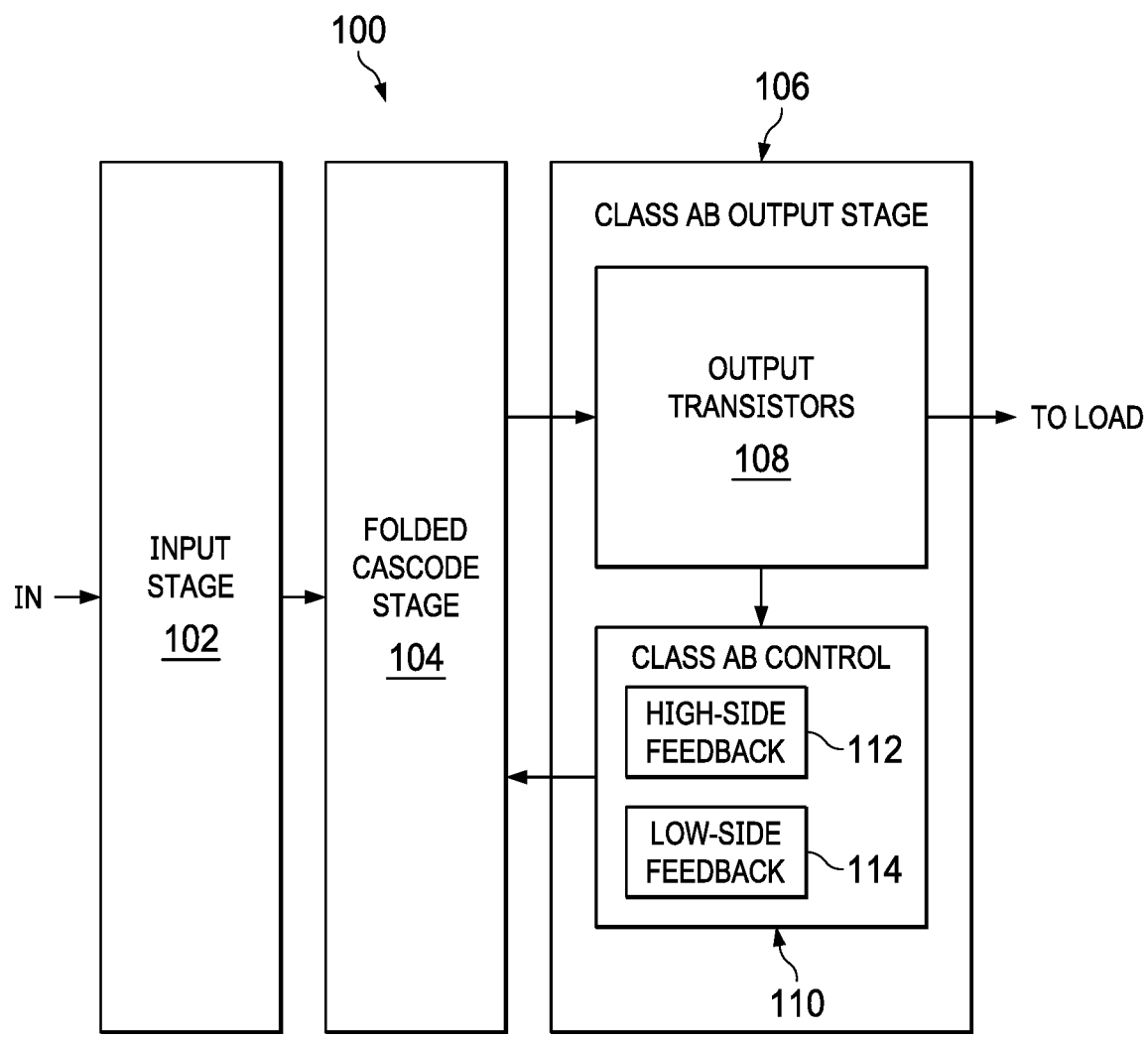
FIG. 1 shows a block diagram of an example of a class AB amplifier in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Operational amplifiers are frequently used in battery power devices or systems in which it is desirable to minimize the energy consumed by the amplifier (e.g., to maximize the operational life of the battery). Reduction of energy consumption is often accomplished by lowering the power supply voltages provided to the operational amplifier.

When attempting to provide low-voltage operation in a class AB amplifier, various requirements of class AB control should be considered. Class AB current should be accurately controlled when load current is near zero to ensure a predetermined minimum capacitive drive capability, as the capacitive drive capability defines the minimum transconductance of the amplifier's output transistors and the load caused pole $g_m/C_{Load}$. Class AB control should also reduce the nonlinear distortions caused by the change in transconductance versus current in the amplifier's output transistors. Maintaining a minimum transconductance, defined by the class AB current, decreases the total transconductance versus load current variation. Further, class AB control should prevent complete shutdown of the output transistors over the full range of load current because shutdown can cause unpredictable distortion and delay in operation.

Some class AB amplifiers provide class AB control using negative feedback circuitry that maintains a minimum input current to each of the output transistors and maintains overall amplifier gain by shifting current from the input of a first output transistor to the input of a second output transistor as the first output transistor is turning off. Some implementations of negative feedback circuitry for controlling class AB operation are operable only at relatively high power supply voltages (e.g., 2.1-2.2 volts). Some implementations are operable at relatively low power supply voltages (1.7-1.8 volts) but require the use of low threshold transistors, which are not available in all semiconductor processes.

The class AB amplifiers disclosed herein include class AB control circuitry that is operable at low power supply voltages (e.g., 1.2-1.5 volts) without use of low threshold transistors.

FIG. 1 shows a block diagram of an example of a class AB amplifier 100 in accordance with the present disclosure. The class AB amplifier 100 includes an input stage 102, a folded cascode stage 104, and a class AB output stage 106. The class AB amplifier 100 may include various circuits and interconnections that have been omitted in the interest of clarity. For example, the input stage 102, the folded cascode stage 104, and the class AB output stage 106 are connected to power supplies that have been omitted from FIG. 1.

The input stage 102 receives an input signal from source external to the class AB amplifier 100, and applies gain to the input signal. The input signal received by the input stage 102 may be differential, and the input stage 102 may include transistors arranged as a differential amplifier. Amplified signal produced by the input stage 102 is provided to the folded cascode stage 104.

The folded cascode stage 104 receives the signal (e.g., the differential signal) output of the input stage 102 and applies additional gain to the received signal. The folded cascode stage 104 may include one or more folded cascode circuits. Each folded cascode circuit may include transistors arranged as current sources and transistors arranged as cascodes. Amplified signal produced by the folded cascode stage 104 is provided to the class AB output stage 106.

The class AB output stage 106 receives the signal (e.g., the differential signal) output of the folded cascode stage 104, and applies additional gain to the received signal as needed to drive a load external to the class AB amplifier 100. The class AB output stage 106 includes output transistors 108 and class AB control circuitry 110. The output transistors 108 include a high-side output transistor and a low-side output transistor, each of which is driven by the signal output of the folded cascode stage 104. The class AB control circuitry 110 includes feedback circuitry that controls the currents flowing in the output transistors 108. The feedback circuitry includes high-side feedback circuitry 112 and low-side feedback circuitry 114. The high-side feedback circuitry 112 senses the current flowing in the high-side output transistor and generates a feedback signal that is provided to the folded cascode stage 104 to adjust the output signal of the folded cascode stage 104 that controls the high-side output transistor. Similarly, the low-side feedback circuitry 114 senses the current flowing in the low-side output transistor and generates a feedback signal that is provided to the folded cascode stage 104 to adjust the output signal of the folded cascode stage 104 that controls the low-side output transistor. The high-side feedback circuitry 112 and low-side feedback circuitry 114 include no low voltage threshold transistors, and accordingly, may be fabricated without special semiconductor processing.

Figure 2:
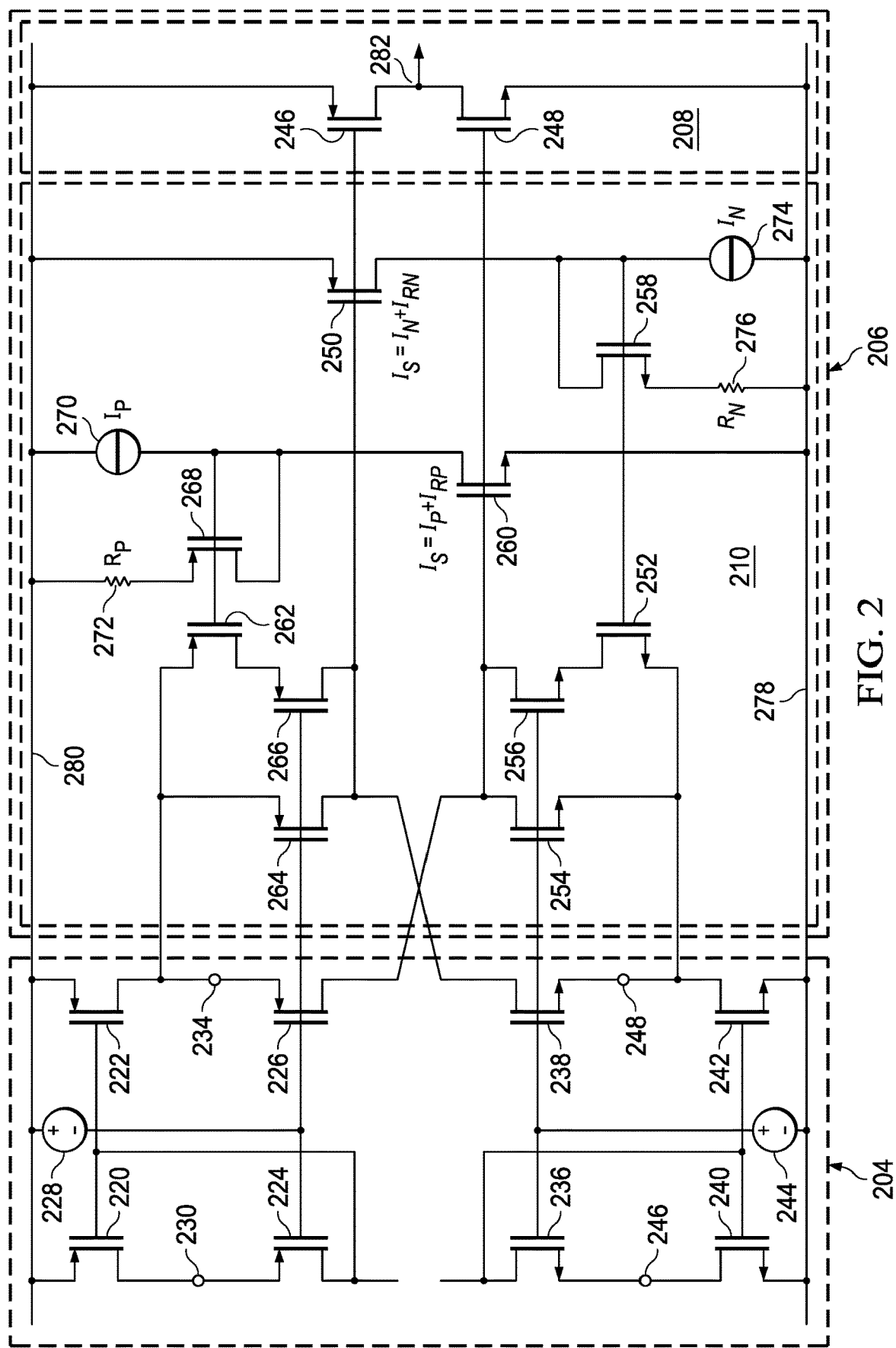
FIG. 2 shows a schematic diagram for an example of a cascode stage and a class AB output stage of an amplifier in accordance with the present disclosure.

FIG. 2 shows a schematic diagram for an example of a folded cascode stage 204 and a class AB output stage 206 of an amplifier in accordance with the present disclosure. The folded cascode stage 204 is an implementation of the folded cascode stage 104, and the class AB output stage 206 is an implementation of the class AB output stage 106. The class AB output stage 206 includes class AB control circuitry 210, which is an implementation of the class AB control circuitry 110, and includes output transistors 208, which is an implementation of the output transistors 108.

The folded cascode stage 204 includes transistor 220, transistor 222, transistor 224, transistor 226, voltage source 228, transistor 236, transistor 238, transistor 240, transistor 242, and voltage source voltage source 244. The transistor 220, the transistor 222, the transistor 224, and the transistor 226 may be p-channel metal oxide semiconductor transistors (MOSFETs). The transistor 236, the transistor 238, the transistor 240, and the transistor 242 may be n-channel MOSFETs. The transistor 220, the transistor 222, the transistor 224, the transistor 226, and the voltage source 228 are arranged as a current summing circuit. The transistor 220 and the transistor 222 are current source transistors. The transistor 224 and the transistor 226 are cascode transistors. A control terminal (e.g., a gate terminal) of the transistor 220 is coupled to a control terminal of the transistor 222. A control terminal of the transistor 224 is coupled to a control terminal of the transistor 226. An output terminal (e.g., a drain terminal) of the transistor 220 is coupled to an input terminal (e.g., a source terminal) of the transistor 224. An output terminal of the transistor 222 is coupled to an input terminal of the transistor 226. An input terminal of the transistor 220 and an input terminal of the transistor 222 are coupled to a reference voltage source 280 (e.g., a power supply rail). The voltage source 228 is coupled to the reference voltage source 280 and to the control terminal of the transistor 224 and the transistor 226. The output terminal of the transistor 224 is coupled to the control terminal of the transistor 220 and the transistor 222.

The transistor 236, the transistor 238, the transistor 240, the transistor 242, and the voltage source 244 are also arranged as a current summing circuit. The transistor 240 and the transistor 242 are current source transistors. The transistor 236 and the transistor 238 are cascode transistors. A control terminal of the transistor 240 is coupled to a control terminal of the transistor 242. A control terminal of the transistor 236 is coupled to a control terminal of the transistor 238. An output terminal (e.g., a source terminal) of the transistor 236 is coupled to an input terminal (e.g., a drain terminal) of the transistor 240. An output terminal of the transistor 238 is coupled to an input terminal of the transistor 242. An output terminal of the transistor 240 and an output terminal of the transistor 242 are coupled to a reference voltage source 278 (e.g., a power supply rail). The voltage source 244 is coupled to the reference voltage source 278 and to the control terminal of the transistor 236 and the transistor 238. The input terminal of the transistor 236 is coupled to the control terminal of the transistor 240 and the transistor 242.

Signal generated in the input stage 102 may be received by the folded cascode stage 204 at nodes 230 and 234, and/or at nodes 246 and 248 of the folded cascode stage 204.

The output transistors 208 include high-side output transistor 246 and low-side output transistor 248. Current flows through the high-side output transistor 246 to the output node 282 to pull the output node 282 towards the voltage present on the reference voltage source 280. Current flows through the low-side output transistor 248 from the output node 282 to the reference voltage source 278 to pull the output node 282 towards the voltage present on the reference voltage source 278. The high-side output transistor 246 may be a p-channel MOSFET and the low-side output transistor 248 may be an n-channel MOSFET. An input terminal of the high-side output transistor 246 may be coupled to the reference voltage source 280, and an output terminal of the high-side output transistor 246 may be coupled to the output node 282. An input terminal of the low-side output transistor 248 may be coupled to the output node 282, and an output terminal of the low-side output transistor 248 may be coupled to the reference voltage source 278. The control terminals of the high-side output transistor 246 and the low-side output transistor 248 are coupled to the folded cascode stage 204 and to the class AB control circuitry 210. Accordingly, the folded cascode stage 204 and the class AB control circuitry 210 provide control signals to the high-side output transistor 246 and the low-side output transistor 248 that control currents flowing in the high-side output transistor 246 and the low-side output transistor 248.

The class AB control circuitry 210 includes a high-side feedback circuit and a low-side feedback circuit that respectively provide feedback signals for controlling the high-side output transistor 246 and the low-side output transistor 248. The high-side feedback circuit includes a high-side sense transistor 250, and a high-side feedback transistor 252. The high-side sense transistor 250 may be a p-channel MOSFET, and the high-side feedback transistor 252 may be an n-channel MOSFET. The high-side sense transistor 250, the high-side feedback transistor 252, and the transistor 238 of the folded cascode stage 204 form a feedback loop that controls the minimum current flowing in the high-side output transistor 246 and the high-side sense transistor 250 to be the current provided by the current source 274. The high-side sense transistor 250 is arranged to sense the current flowing in the high-side output transistor 246. The control terminal of the high-side sense transistor 250 is coupled to the control terminal of the high-side output transistor 246, and the input terminal of the high-side sense transistor 250 is coupled to the reference voltage source 280. The output terminal of the high-side sense transistor 250 is coupled to the current source 274 and to the control terminal of the high-side feedback transistor 252. The current source 274 is coupled to the reference voltage source 278.

The current flowing in the high-side sense transistor 250 is proportional to the current flowing in the high-side output transistor 246. Accordingly, the voltage at the control terminal of the high-side feedback transistor 252 is proportional to the current flowing in the high-side output transistor 246, and the voltage at the control terminal of the high-side feedback transistor 252 decreases as the current flowing in the high-side output transistor 246 decreases. The resistance of the high-side feedback transistor 252 increases with decreasing control voltage, which in-turn changes the ratio of current flowing in the transistor 238 to the current flowing in the transistor 254 and the transistor 256. The transistor 238 is coupled to the control terminals of the high-side output transistor 246 and the high-side sense transistor 250 to complete the high-side feedback loop. To ensure stability, the high-side feedback transistor 252 operates in trioding mode as a degeneration resistor.

The transistor 254 and the transistor 256 may be n-channel MOSFETs. The control terminals of the transistor 254 and the transistor 256 are coupled to the control terminal of the transistor 238. The input terminals of the transistor 254 and the transistor 256 are coupled to the output terminal of the transistor 226 to control the voltage at the control terminals of the low-side output transistor 248 and the low-side sense transistor 260. The output terminal of the transistor 256 is coupled to the input terminal of the high-side feedback transistor 252. The transistor 256 is included in some implementations of the class AB control circuitry 210 to reduce the gain of the high-side feedback loop. Some implementations class AB control circuitry 210 may not include the transistor 256. Current subtracted from the control terminal of the high-side output transistor 246 by operation of the high-side feedback transistor 252 is added to the control terminal of the low-side output transistor 248 to keep the overall gain of the class AB amplifier 100 stable.

The transistor 258 is connected as a diode and included in some implementations to reduce the impedance at the control terminal of the high-side feedback transistor 252, which improves the stability of the high-side feedback loop. The transistor 258 may be an n-channel MOSFET. The input terminal and the control terminal of the transistor 258 are coupled to the output terminal of the high-side sense transistor 250. The output terminal of the transistor 258 is coupled to the reference voltage source 278 via a resistor 276. In some implementations of the class AB control circuitry 210, the current source 274 may be connected in series with the resistor 276 to limit current in the output transistor 246 when load current is high.

Operation of the low-side feedback circuit is similar to that of the high-side feedback circuit. The low-side feedback circuit includes a low-side sense transistor low-side sense transistor 260, and a low-side feedback transistor 262. The low-side sense transistor 260 may be an n-channel MOSFET, and the low-side feedback transistor 262 may be a p-channel MOSFET. The low-side sense transistor 260, the low-side feedback transistor 262, and the transistor 226 of the folded cascode stage 204 form a feedback loop that controls the minimum current flowing in the low-side output transistor 248 and the low-side sense transistor 260 to be the current provided by the current source 270. The low-side sense transistor 260 is arranged to sense the current flowing in the low-side output transistor 248. The control terminal of the low-side sense transistor 260 is coupled to the control terminal of the low-side output transistor 248, and the output terminal of the low-side sense transistor 260 is coupled to the reference voltage source 278. The input terminal of the low-side sense transistor 260 is coupled to the current source 270 and to the control terminal of the low-side feedback transistor 262. The current source 270 is coupled to the reference voltage source 280.

The current flowing in the low-side sense transistor 260 is proportional to the current flowing in the low-side output transistor 248. Accordingly, the voltage at the control terminal of the low-side feedback transistor 262 is inversely proportional to the current flowing in the low-side output transistor 248, and the voltage at the control terminal of the low-side feedback transistor 262 increases as the current flowing in the low-side output transistor 248 decreases. The resistance of the low-side feedback transistor 262 increases with increasing control voltage, which in-turn changes the ratio of current flowing in the transistor 226 to the current flowing in the transistor 264 and the transistor 266. The transistor 226 is coupled to the control terminals of the low-side output transistor 248 and the low-side sense transistor 260 to complete the low-side feedback loop. To ensure stability, the low-side feedback transistor 262 operates in trioding mode as a degeneration resistor.

The transistor 264 and the transistor 266 may be p-channel MOSFETs. The control terminals of the transistor 264 and the transistor 266 are coupled to the control terminal of the transistor 226. The output terminals of the transistor 264 and the transistor 266 are coupled to the input terminal of the transistor 238 to control the voltage at the control terminals of the high-side output transistor 246 and the high-side sense transistor 250. The input terminal of the transistor 266 is coupled to the output terminal of the low-side feedback transistor 262. The transistor 266 is included in some implementations to reduce the gain of the low-side feedback loop. Some implementations of the class AB control circuitry 210 may not include the transistor 266. Current subtracted from the control terminal of the low-side output transistor 248 by operation of the low-side feedback transistor 262 is added to the control terminal of the high-side output transistor 246 to keep the overall gain of the class AB amplifier 100 stable.

The transistor 268 is connected as a diode and included in some implementations to reduce the impedance at the control terminal of the low-side feedback transistor 262, which improves the stability of the low-side feedback loop. The transistor 268 may be a p-channel MOSFET. The output terminal and the control terminal of the transistor 268 are coupled to the input terminal of the low-side sense transistor 260. The input terminal of the transistor 268 is coupled to the reference voltage source 280 via a resistor 272. In some implementations of the class AB control circuitry 210, the current source 270 may be connected in series with the resistor 272 to limit current in the output transistor 248 when load current is high.

The class AB control circuitry, and the class AB amplifier 100, operate at power supply voltages as lows 1.2 volts. Because the class AB control circuitry 210 does not require the use low threshold voltage transistors, the class AB control circuitry 210 can be fabricated using a variety of semiconductor processes that do not support fabrication of low threshold voltage transistors. Furthermore, because the class AB control circuitry 210 does not require the use low threshold voltage transistors the gain provided by the class AB amplifier 100 is higher than class AB amplifiers that achieve low voltage operation using low threshold voltage transistors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An amplifier, comprising:
   an input stage;
   a folded cascode stage coupled to the input stage; and
   a class AB output stage coupled to the folded cascode stage, the class AB output stage comprising:
   a high-side output transistor;
   a low-side output transistor; and
   a high-side feedback circuit coupled to the high-side output transistor, the high-side feedback circuit comprising:
   a high-side sense transistor comprising a control terminal, wherein the control terminal of the high-side sense transistor is coupled to a control terminal of the high-side output transistor; and
   a high-side feedback N-type field-effect transistor (NFET), a gate of the high-side feedback NFET coupled to an output of the high-side sense transistor and a source of the high-side feedback NFET coupled to the folded cascode stage;
   wherein a first output of the folded cascode stage is coupled to the control terminal of the high-side sense transistor and the control terminal of the high-side output transistor.

2. The amplifier of claim 1, further comprising:
   a low-side feedback circuit coupled to the low-side output transistor, the low-side feedback circuit comprising:
   a low-side sense transistor comprising a control terminal, wherein the control terminal of the low-side sense transistor is coupled to a control terminal of the low-side output transistor; and
   a low-side feedback transistor coupled to an output of the low-side sense transistor and to the folded cascode stage;

wherein a second output of the folded cascode stage is coupled to the control terminal of the low-side sense transistor and the control terminal of the low-side output transistor.

3. A class AB amplifier, comprising:

a folded cascode stage; and a class AB output stage coupled to the folded cascode stage, the class AB output stage comprising:

a high-side output transistor having a control terminal, a first current terminal and a second current terminal, wherein the first current terminal is coupled to a supply voltage source;

a low-side output transistor having a control terminal, a first current terminal and a second current terminal, wherein the first current terminal is coupled to a reference voltage source and the second current terminal is coupled to the second current terminal of the high-side output transistor;

a high-side feedback circuit coupled to the high-side output transistor, the high-side feedback circuit including:

a high-side sense transistor having:

a control terminal coupled to the control terminal of the high-side output transistor, a first current terminal coupled to the supply voltage source, and a second current terminal; and a first current source having a first terminal coupled to the second current terminal of the high-side sense transistor and a second terminal coupled to the reference voltage source;

wherein a first output of the folded cascode stage is coupled to the control terminal of the high-side sense transistor and to the control terminal of the high-side output transistor;

a low-side feedback circuit coupled to the low-side output transistor, the low-side feedback circuit including:

a low-side sense transistor having:

a control terminal coupled to the control terminal of the low-side output transistor, a first current terminal coupled to the reference voltage source, and a second current terminal; and a second current source having a first terminal coupled to the second current terminal of the low-side sense transistor and a second terminal coupled to the first terminal of the high-side sense transistor;

wherein a second output of the folded cascode stage is coupled to the control terminal of the low-side sense transistor and to the control terminal of the low-side output transistor.

4. The class AB amplifier of claim 3, further comprising a high-side feedback transistor having a control terminal coupled to the second current terminal of the high-side sense transistor and a current terminal coupled to the folded cascode stage.

5. The class AB amplifier of claim 3, further comprising a low-side feedback transistor having a control terminal coupled to the second current terminal of the low-side sense transistor and a current terminal coupled to the folded cascode stage.

6. A class AB amplifier, comprising:

a high-side output transistor having a control terminal, a first current terminal and a second current terminal, wherein the first current terminal is coupled to a supply voltage source;

a low-side output transistor having a control terminal, a first current terminal and a second current terminal, wherein the first current terminal is coupled to a reference voltage source and the second current terminal is coupled to the second current terminal of the high-side output transistor;

a folded cascode stage coupled to the high-side output transistor and the low-side output transistor;

a high-side feedback circuit coupled to the high-side output transistor, the high-side feedback circuit including:

a high-side sense transistor having:

a control terminal coupled to the control terminal of the high-side output transistor, a first current terminal coupled to the supply voltage source, and a second current terminal; and a high-side feedback transistor having a control terminal coupled to the second current terminal of the high-side sense transistor and a current terminal coupled to the folded cascode stage;

wherein a first output of the folded cascode stage is coupled to the control terminal of the high-side sense transistor and to the control terminal of the high-side output transistor; and a low-side feedback circuit coupled to the low-side output transistor, the low-side feedback circuit including:

a low-side sense transistor having:

a control terminal coupled to the control terminal of the low-side output transistor, a first current terminal coupled to the reference voltage source, and a second current terminal; and a low-side feedback transistor having a control terminal coupled to the second current terminal of the low-side sense transistor and a current terminal coupled to the folded cascode stage;

wherein a second output of the folded cascode stage is coupled to the control terminal of the low-side sense transistor and to the control terminal of the low-side output transistor.

* * * * *